(12) United States Patent
Nakayama et al.

(10) Patent No.: US 11,107,698 B2
(45) Date of Patent: Aug. 31, 2021

(54) SUBSTRATE TREATING METHOD

(71) Applicant: SCREEN Holdings Co., Ltd., Kyoto (JP)

(72) Inventors: Chisayo Nakayama, Kyoto (JP); Yuji Tanaka, Kyoto (JP); Masahiko Harumoto, Kyoto (JP); Masaya Asai, Kyoto (JP); Yasuhiro Fukumoto, Kyoto (JP); Tomohiro Matsuo, Kyoto (JP); Takeharu Ishii, Kyoto (JP)

(73) Assignee: SCREEN Holdings Co., Ltd.

( * ) Notice: Subject to any disclaimer, the term of this patent is extended or adjusted under 35 U.S.C. 154(b) by 145 days.

(21) Appl. No.: 16/480,728

(22) PCT Filed: Oct. 24, 2017

(86) PCT No.: PCT/JP2017/038378
§ 371 (c)(1),
(2) Date: Jul. 25, 2019

(87) PCT Pub. No.: WO2018/150635
PCT Pub. Date: Aug. 23, 2018

(65) Prior Publication Data
US 2021/0134605 A1 May 6, 2021

(30) Foreign Application Priority Data
Feb. 14, 2017 (JP) .............................. JP2017-025228

(51) Int. Cl.
*H01L 21/324* (2006.01)
*H01L 21/67* (2006.01)

(52) U.S. Cl.
CPC ...... *H01L 21/324* (2013.01); *H01L 21/67103* (2013.01)

(58) Field of Classification Search
CPC ............. H01L 21/324; H01L 21/67103; H01L 21/0338; H01L 21/67098; H01L 21/67109; H01L 21/68742
See application file for complete search history.

(56) References Cited

U.S. PATENT DOCUMENTS

| | | | |
|---|---|---|---|
| 2002/0007791 A1 | 1/2002 | Horiguchi et al. | ........... 118/715 |
| 2002/0063119 A1* | 5/2002 | Tanaka | .............. H01L 21/67253 219/390 |

(Continued)

FOREIGN PATENT DOCUMENTS

| | | |
|---|---|---|
| JP | H10-223515 A | 8/1998 |
| JP | H10-335203 A | 12/1998 |

(Continued)

OTHER PUBLICATIONS

Office Action and Search Report dated Sep. 8, 2020 for corresponding Japanese Patent Application No. 2017-025228.

(Continued)

*Primary Examiner* — Dung A. Le
(74) *Attorney, Agent, or Firm* — Ostrolenk Faber LLP

(57) ABSTRACT

An oxygen concentration is lowered in accordance with a set lowering process, and thereafter a heat treatment is performed. Accordingly, the heat treatment is performed to a substrate W while the oxygen concentration in a heat treating space HS is lowered. Consequently, a treatment atmosphere within the heat treating space is able to be made suitable for a heat treatment process, leading to appropriate film deposition. In addition, the oxygen concentration is lowered in accordance with a concentration level in recipes. This avoids an excessively lowered oxygen concentration, leading to prevention of reduced throughput.

5 Claims, 4 Drawing Sheets

(56) References Cited

U.S. PATENT DOCUMENTS

| | | |
|---|---|---|
| 2002/0076659 A1 | 6/2002 | Shinya et al. ............... 430/324 |
| 2006/0079096 A1 | 4/2006 | Nakamori et al. ............ 438/725 |
| 2007/0169373 A1 | 7/2007 | Aoki et al. ..................... 34/549 |
| 2008/0193658 A1 | 8/2008 | Millward .................... 427/401 |
| 2009/0236309 A1 | 9/2009 | Millward et al. .............. 216/39 |
| 2012/0269603 A1* | 10/2012 | Toba ................. H01L 21/67757 414/160 |
| 2013/0133825 A1 | 5/2013 | Hattori et al. ............. 156/272.2 |
| 2014/0022521 A1 | 1/2014 | Harumoto et al. ............. 355/27 |
| 2014/0273522 A1 | 9/2014 | Rathsack .................... 438/781 |
| 2015/0062545 A1 | 3/2015 | Muramatsu et al. .......... 355/30 |
| 2016/0189974 A1 | 6/2016 | Shiozawa et al. |
| 2021/0082724 A1* | 3/2021 | Xie ................... H01J 37/32357 |

FOREIGN PATENT DOCUMENTS

| | | |
|---|---|---|
| JP | 2001-102321 A | 4/2001 |
| JP | 2002-057209 A | 2/2002 |
| JP | 2002-184682 A | 6/2002 |
| JP | 2006-113102 A | 4/2006 |
| JP | 2007-201037 A | 8/2007 |
| JP | 2010-522643 A | 7/2010 |
| JP | 2011-515537 A | 5/2011 |
| JP | 2012-033534 A | 2/2012 |
| JP | 2014-022570 A | 2/2014 |
| JP | 5918122 B2 | 5/2016 |
| JP | 2016-518701 A | 6/2016 |
| JP | 2016-127063 A | 7/2016 |

OTHER PUBLICATIONS

International Search Report dated Dec. 19, 2017 in corresponding PCT International Application No. PCT/JP2017/038378.
Written Opinion dated Dec. 19, 2017 in corresponding PCT International Application No. PCT/JP2017/038378.
Notice of Allowance dated Jun. 24, 2021 for corresponding Korea Patent Application No. 10-2019-7022460.

* cited by examiner

SUBSTRATE TREATING METHOD

CROSS-REFERENCE TO RELATED APPLICATIONS

The present application is a 35 U.S.C. §§ 371 national phase conversion of PCT/JP2017/038378, filed Oct. 24, 2017, which claims priority to Japanese Patent Application No. 2017-025228, filed Feb. 14, 2017, the contents of both of which are incorporated herein by reference. The PCT International Application was published in the Japanese language.

TECHNICAL FIELD

The present invention relates to a substrate treating method and an apparatus therefor of performing a heat treatment to a semiconductor wafer, a substrate for liquid crystal display, a substrate for flat panel display (FPD) such as an organic EL (Electroluminescence) display device, a substrate for optical display, a magnetic disk substrate, an optical magnetic disk substrate, a substrate for photomask, and a solar cell substrate (hereinafter, simply referred to as a substrate.)

BACKGROUND ART

In recent process technologies, attention has been focused on a DSA process, for example, as a technology instead of immersion lithography or extreme ultraviolet (EUV) lithography. The DSA process is performed with a directed self-assembly (DSA) technology using micro phase separation of a block co-polymer for achieving much finer design rules on substrates.

In the currently-used substrate treating method in the DSA process, a block co-polymer (BCP) is applied to a substrate for deposition of a treated film, and thereafter, a heat treatment of heating the treated film on the substrate is performed in a heat treating space of a heat treating chamber, whereby (phase) separation of two types of polymers in the treated film is performed. Then, etching is performed to one of the (phase) separated polymers, whereby fine patterns are formed. See, for example, Japanese Unexamined Patent Publication No. 2014-22570A.

PRIOR ART DOCUMENT

Patent Literature

[Patent Literature 1]
Japanese Unexamined Patent Publication No. 2014-22570A

SUMMARY OF INVENTION

Technical Problem

However, the conventional example with such a configuration as above possesses the following drawback. Specifically, in the currently-used method, such a problem may arise as the polymer in the treated film is not able to be separated appropriately depending on a treatment atmosphere in the heat treating space. Moreover, the deposited film may pose some difficulty in its property and performance depending on a treatment atmosphere in the heat treating space also during a process of performing heat treatment to the substrate within the heat treating chamber other than the DSA process, the process including process of depositing a film by a heat treatment after a spin on glass (SOG) solution is applied to the substrate.

The present invention has been made regarding the state of the art noted above, and its one object is to provide a substrate treating method and an apparatus therefor that allow appropriate film deposition by producing a suitable treatment atmosphere within a heat treating space in a heat treatment process.

Solution to Problem

To fulfill the above object, Inventors of the present invention have made intensive research and attained the following findings. Attention was focused on an influence of oxygen within a heat treating space in view of a relationship between various parameters of the heat treating space and a separated condition of a polymer after a heat treatment under different treatment atmospheres within the heat treating space of the heat treating chamber. Such attention was made based on the finding that inappropriate phase separation of the polymers was performed during the heat treatment where an oxygen concentration in the heat treating space was lowered incompletely. Now, it is estimated that, if the oxygen concentration is lowered incompletely, the polymer is adversely affected upon phase separation thereof, and accordingly normal phase separation is inhibited. Also, in heat treatment processes other than the DSA process, oxidation caused by oxygen adversely affects a property of film deposition. The drawback described above is overcome if the oxygen concentration is lowered. On the other hand, it takes a long time to lower the oxygen concentration. If the oxygen concentration is uniformly lowered although a certain film is less influenced by the oxygen concentration, another different drawback arises that it takes a long time to lower the oxygen concentration, leading to reduced throughput. The present invention based on such finding as above is constituted as under.

The present invention is constituted as stated below to achieve the above object. One aspect of the present invention in claim 1 discloses a substrate treating method for performing a heat treatment to a substrate having a treated film formed thereon within a heat treating space of a heat treatment chamber. The method includes a setting step of setting a lowering process in accordance with a concentration level from recipes where conditions of treating the substrate are specified; an oxygen concentration lowering step of lowering an oxygen concentration in the heat treating space in accordance with the set lowering process; and a heat treatment step of performing a heat treatment to the substrate within the heat treating space after the setting step and the oxygen concentration lowering step.

Effect

With the aspect of the present invention in claim 1, the oxygen concentration is lowered in the oxygen concentration lowering step in accordance with the lowering process set in the setting step, and thereafter the heat treatment is performed in the heat treatment step. Accordingly, the heat treatment is performed while the oxygen concentration in the heat treating space is lowered. Consequently, the treatment atmosphere within the heat treating space is able to be made suitable for the heat treatment process, leading to appropriate film deposition. In addition, the oxygen concentration is only needed to be lowered in accordance with the concentration level in the recipes. This avoids an excessively lowered oxygen concentration, leading to prevention of the reduced throughput.

It is preferred in the aspect of the present invention that the oxygen concentration lowering step includes an exhausting step of exhausting gases within the heat treating space, and an inert gas supplying step of supplying an inert gas into the heat treating space (claim 2).

Since the gases are exhausted and the inert gas is additionally supplied, the oxygen is effectively ejectable from the heat treating space.

Moreover, it is preferred in the aspect of the present invention that the oxygen concentration lowering step includes an exhausting step of exhausting gases within the heat treating space (claim 3).

Only the gases are exhausted without supplying any inert gas, whereby oxygen is ejected from the heat treating space. Consequently, no inert gas is used, leading to a suppressed manufacturing cost.

Moreover, it is preferred in the aspect of the present invention that the exhausting step is performed from through holes through which support pins moving forward/backward from a heat treating plate are inserted (claim 4).

The gases are exhausted from the through holes disposed on a rear side of the substrate, leading to a stable airflow in a heat treatment atmosphere around a front face of the substrate. Therefore, the heat treatment to the treated film is performable in a stable manner.

It is preferred in the aspect of the present invention that the exhausting step is performed from an exhaust port of a cover that surrounds a heat treating plate and through holes through which support pins moving forward/backward from the heat treating plate are inserted (claim 5).

The gases are exhausted from both the exhaust port and the through holes, achieving a constantly low oxygen concentration for a short period of time.

Moreover, it is preferred in the aspect of the present invention that the treated film is made from a directed self-assembly material (claim 6).

This makes the treatment atmosphere within the heat treating space suitable for the DSA process, achieving appropriate (phase) separation of the polymer.

Moreover, another aspect of the present invention in claim 7 discloses a substrate treating apparatus that performs a heat treatment to a substrate having a treated film formed thereon within a heat treating space. The substrate treating apparatus includes a heat treating plate where the substrate as a treatment target is placed, a cover that surrounds the heat treating plate to form an interior heat treating space, an oxygen concentration lowering device that lowers an oxygen concentration in the heat treating space, a setting device that sets a lowering process in accordance with a level of the concentration level from recipes where conditions of treating the substrate are specified, and a controller that performs control to operate the oxygen concentration lowering device in accordance with the lowering process set with the setting device to lower the oxygen concentration in the heat treating space and to perform the heat treatment to the substrate within the heat treating space.

Effect

With the aspect of the present invention in claim 7, the controller performs the control to operate the oxygen concentration lowering device in accordance with the lowering process set with the setting device to lower the oxygen concentration in the heat treating space and to perform the heat treatment to the substrate within the heat treating space. Accordingly, the heat treatment is performed while the oxygen concentration in the heat treating space is lowered. Consequently, the treatment atmosphere within the heat treating space is able to be made suitable for the heat treatment process, leading to appropriate film deposition. In addition, the oxygen concentration is only needed to be lowered in accordance with the concentration level in the recipes. This avoids an excessively lowered oxygen concentration, leading to prevention of the reduced throughput.

Moreover, it is preferred in the aspect of the present invention that the oxygen concentration lowering device exhausts gases within the heat treating space and supplies an inert gas to the heat treating space (claim 8).

Since the controller performs the control to exhaust the gases and supply the inert gas additionally, the oxygen is effectively ejectable from the heat treating space.

Moreover, it is preferred in the aspect of the present invention that the oxygen concentration lowering device exhausts the gases within the heat treating space (claim 9).

The controller performs the control to eject the oxygen from the heat treating space only by exhausting the gases without supplying any inert gas. Consequently, no inert gas is used, leading to a suppressed manufacturing cost.

It is preferred in the aspect of the present invention that the substrate treating apparatus further includes an inert gas supplying device that supplies the inert gas into the heat treating space; and through holes through which support pins moving forward/backward from the heat treating plate are inserted, and that the oxygen concentration lowering device exhausts the gases within the heat treating space from the through holes and the inert gas supplying device supplies the inert gas (claim 10).

The oxygen concentration lowering device exhausts the gases from the through holes disposed on the rear side of the substrate, and the inert gas supplying device supplies the inert gas, leading to a stable airflow in a heat treatment atmosphere around the front face of the substrate. Therefore, the heat treatment to the treated film is performable in a stable manner.

Moreover, it is preferred in the aspect of the present invention that the substrate treating apparatus includes through holes through which support pins moving forward/backward from the heat treating plate are inserted, and an exhaust port of a cover that surrounds the heat treating plate, and that the oxygen concentration lowering device exhausts the gases within the heat treating space from the exhaust port and the through holes (claim 11).

Since the oxygen concentration lowering device exhausts the gases within the heat treating space from both the exhaust port and the through holes, achieving a constantly low oxygen concentration for a short period of time.

Advantageous Effects of Invention

With the substrate treating method according to the aspect of the present invention, the oxygen concentration is lowered in the oxygen concentration lowering step in accordance with the lowering process set in the setting step, and thereafter the heat treatment is performed in the heat treatment step. Accordingly, the heat treatment is performed while the oxygen concentration in the heat treating space is lowered. Consequently, the treatment atmosphere within the heat treating space is able to be made suitable for the heat treatment process, leading to appropriate film deposition. In addition, the oxygen concentration is only needed to be lowered in accordance with the concentration level in the recipes. This avoids an excessively lowered oxygen concentration, leading to prevention of the reduced throughput.

DESCRIPTION OF EMBODIMENTS

Figure 1:
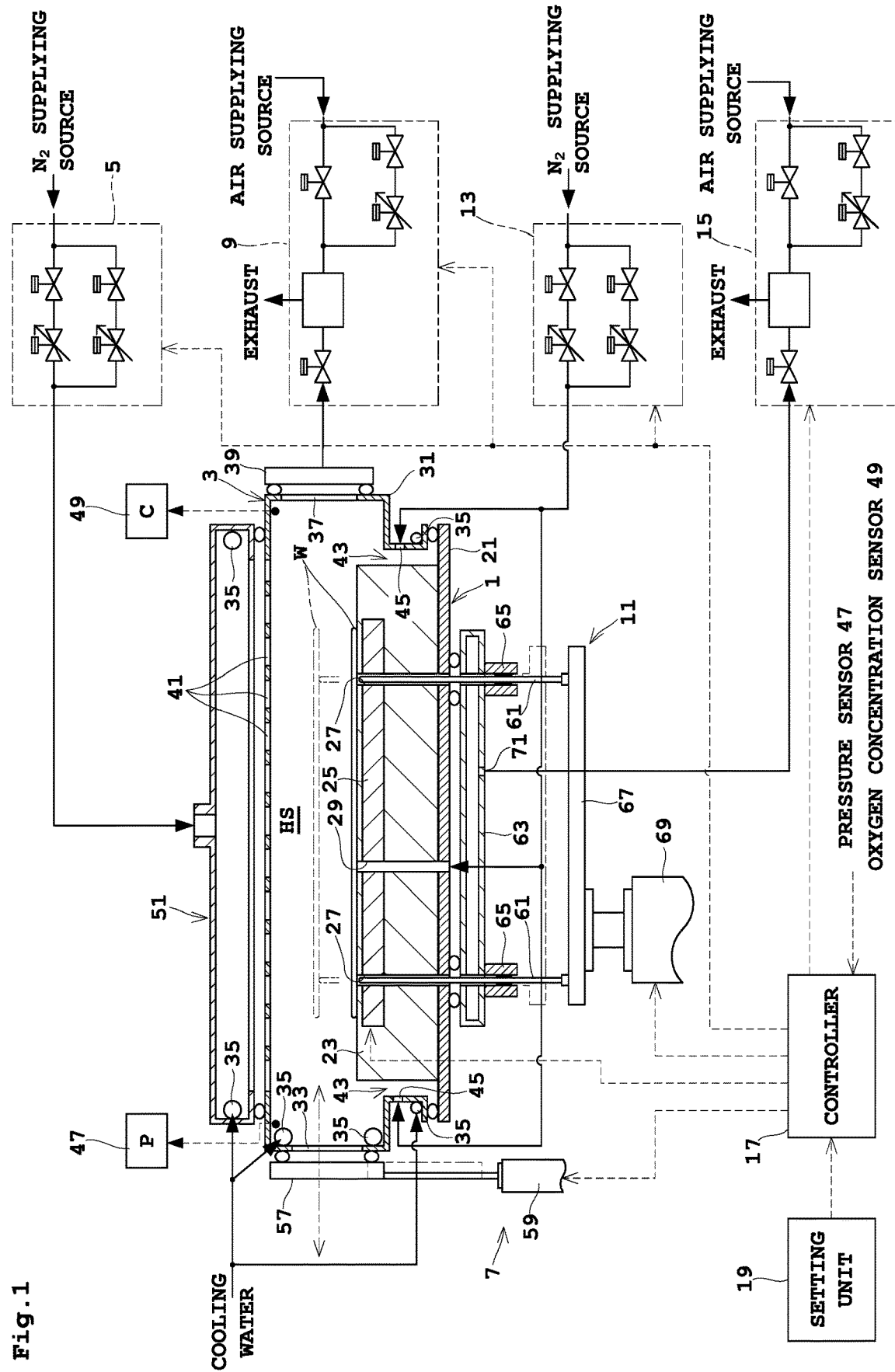
FIG. 1 schematically illustrates an overall configuration of a substrate treating apparatus according to one embodiment of the present invention.

The following describes one embodiment of the present invention with reference to drawings. FIG. 1 schematically illustrates an overall configuration of a substrate treating apparatus according to one embodiment of the present invention.

The substrate treating apparatus according to the present embodiment for executing a substrate treating method is used for performing a heat treatment to a substrate W. Examples of the substrate W in the present embodiment include one having a treated film made from a directed self-assembly material deposited on a front face thereof.

The substrate treating apparatus according to the present embodiment includes a heat treatment plate unit 1, a heat treating chamber 3, an upper gas supply unit 5, a shutter 7, a chamber exhaust unit 9, a support pin lifting member 11, a lower gas supply unit 13, a support pin seal exhaust unit 15, a controller 17, and a setting unit 19.

The heat treatment plate unit 1 places the substrate W on its top face for performing a heat treatment to the substrate W. The heat treatment plate unit 1 includes a base plate 21, a heat treating plate 23, and a heater 25. The base plate 21 is attached to a lower part of the heat treating plate 23, and is also attached to a lower part of the heat treatment chamber 3 together with the heat treating plate 23. The heat treating plate 23 is composed of a material whose base material is a metal, such as copper (Cu) and aluminum (Al), with a high thermal conductivity. The heater 25 is embedded in the heat treating plate 23, and controls a temperature of the heat treating plate 23. For instance, the heater 23 controls a temperature of the heat treating plate 23 within a range of 300 to 400° C. The heat treating plate 23 has proximity balls, not shown, embedded in its front face for locating a rear face of the substrate W apart from the front face of the heat treating plate 23 by a given interval (e.g., 0.1 mm).

The heat treating plate 23 has through holes 27 formed at positions corresponding to vertexes of a regular triangle in plan view. The through holes 27 each pass from a top face to the rear face of the heat treating plate 23, and also pass through the base plate 21. Holder pins mentioned later are inserted into the through holes 27, respectively. Moreover, a topside plate supply port 29 passing the heat treating plate 23 and the base plate 21 in a vertical direction is formed around the center of the heat treating plate 23.

The heat treatment chamber 3 includes a cover 31. The cover 31 includes an opening at a lower portion thereof, and the heat treatment plate unit 1 is attached to the opening. The cover 31 shows a shape that covers a lateral side and an upper side of the heat treatment plate unit 1. A space is formed between the ceiling of the cover 31 and the top face of the heat treating plate 23. The space corresponds to a heat treating space HS. The cover 31 has a load outlet 33 formed on a first side face thereof. The load outlet 33 is used for loading a substrate W to be treated into the heat treating space HS and unloading the treated substrate W from the heat treating space HS. A cooling pipe 35 is attached around the load outlet 33. The cooling pipe 35 cools the cover 31 with cooling water supplied thereto, and protects an O-ring around the load outlet 33.

The cover 31 has an exhaust port 37 formed on a second side face thereof, which is opposite to the load outlet 33. The exhaust port 37 is used for exhausting gas within the cover 31. The exhaust port 37 has a flow path sectional area corresponding to a vertical sectional area of the heat treating space HS. An exhaust port cover 39 is removably attached to the outside of the exhaust port 37 via the O-ring. The ceiling of the cover 31 includes a plurality of through holes 41. An annular gap 43 in plan view is present between the heat treatment plate unit 1 and an outer peripheral surface of the heat treating plate 23 of the cover 31 around the heat treatment plate unit 1. A side face of the cover 31 facing to the gap 43 has openings 45 each in communication with the gap 43. The openings 45 are, for example, formed at two positions facing to each other across the center of the heat treating plate 23 in plan view. The cooling pipe 35 is disposed at an outer face of the cover 31 below the openings 45. The cooling pipe 35 protects the O-ring between the cover 31 and the base plate 21. The lower gas supply unit 13 supplies nitrogen gas into the openings 45 and the topside plate supply port 29. The lower gas supply unit 13 includes a plurality of flow rate regulating valves or on-off valves for allowing regulation of a flow rate of the nitrogen gas.

The exhaust port 37 exhausts gas through the exhaust port having the flow path sectional area corresponding to the vertical sectional area of the heat treating space HS, leading to efficient exhaust.

Here, the through hole 27 and the exhaust port 37 correspond to the "heat treating oxygen concentration lowering device" in the present invention.

A pressure sensor 47 is disposed above the cover 31 adjacent to the load outlet 33. An oxygen concentration sensor 49 is disposed above the cover 31 adjacent to the exhaust port 37. The pressure sensor 47 determines pressure within the heat treating space HS. The oxygen concentration sensor 49 determines an oxygen concentration in the heat treating space HS. As is described hereunder, it should be noted that the oxygen concentration sensor 49 is only used when an examination is performed to determine lapsed time during which the oxygen concentration is lowered to a target value or less, and accordingly, the oxygen concentration sensor 49 is not necessarily provided during normal treatment.

A gas supply buffer 51 is disposed above the cover 31. Here, nitrogen ($N_2$) gas supplied from the center of the top face of the cover 31 is supplied from an underside opening of the cover 31, having a larger area than the center of the top face, through a plurality of through holes 41 into the heat treating space HS. An O-ring is disposed between the top face of the cover 31 and an under face of the gas supply buffer 51. Another cooling pipe 35 is disposed inside of the gas supply buffer 51. The cooling pipe 35 protects the O-ring. The upper gas supply unit 5 supplies nitrogen gas as inert gas into the gas supply buffer 51 mentioned above. The upper gas supply unit 5 includes two flow rate regulating valves, for example, that allow switch of a flow rate of the nitrogen gas in two steps.

Here, the topside plate supply port 29, the openings 45, and the gas supply buffer 51 correspond to the "inert gas supplying device" and the "oxygen concentration lowering device" in the present invention.

The shutter 7 is disposed on a front face of the load outlet 33. The shutter 7 includes a shutter body 57, and an actuator 59. The shutter body 57 is lifted by the actuator 59 whose actuating pieces move upwardly/downwardly in a vertical direction. The shutter body 57 closes the load outlet 33 via the O-ring when moving upwardly. When the actuator 59 is brought into an actuated state, the shutter body 57 moves to a position denoted by solid lines in FIG. 1 to close the load outlet 33. When the actuator 59 is brought into a non-actuated state, the shutter body 57 moves downwardly to a position denoted by chain double-dashed lines in FIG. 1 to open the load outlet 33.

The chamber exhaust unit 9 exhausts gas within the heat treating space HS via the exhaust port cover 39 mentioned above. The chamber exhaust unit 9 includes a plurality of on-off valves, flow rate regulating valves, aspirators, and the like, for exhausting the gas within the heat treating space HS by supplying air from an air supplying source. It should be noted that the chamber exhaust unit 9 may be formed by an exhaust pump and the like instead of the aspirators and the air supplying source.

The support pin lifting member 11 includes three support pins 61 (two of which are only denoted in FIG. 1 for an illustrational reason), a manifold 63, mechanical seals 65, a lifting member 67, and an actuator 69. The support pins 61 are inserted into the through holes 27, respectively. The support pins 61 pass through the manifold 63 and are coupled at lower ends thereof to the lifting member 67 via the mechanical seals 65. An O-ring is attached between the top face of the manifold 63 and the base plate 21 so as to surround each of the through holes 27. Upper ends of the mechanical seals 65 are attached to an under face of the manifold 63. The mechanical seals 65 are metal seals that allow upward/downward movement of the support pins 61 while supporting outer peripheral surfaces of the support pins 61 in a sealing manner. The manifold 63 shows a triangle shape in plan view, and has one space formed therein. The manifold 63 has an exhaust port 71 formed at one region thereof in communication with the space.

The lifting member 67 shows an annular shape in plan view, and is moved upwardly/downwardly by the actuator 69. The actuator 69 is disposed in an attitude where the actuating pieces are moved forward/backward in the vertical direction. When the actuator 69 is brought into an actuated state, the support pins 61 project to move to the delivery position denoted by chain double-dashed lines in FIG. 1. When the actuator 69 is brought into a non-actuated state, the support pins 61 move to the retracted position denoted by solid lines in FIG. 1. When the support pins 61 move to the retracted position, the substrate W is placed on the top face of the heat treating plate 23.

The support pin seal exhaust unit 15 exhausts gas from an exhaust port 71 of the manifold 63. The support pin seal exhaust unit 15 includes a plurality of on-off valves, flow rate regulating valves, aspirators, and the like for exhausting gas within the heat treating space HS through the manifold 63 and the through holes 27 by supplying air from an air supplying source. In addition, dust generated on the mechanical seals 65 is discharged simultaneously. It should be noted that the support pin seal exhaust unit 15 may be formed by a vacuum pump instead of the aspirators and the air supplying source.

The support pin seal exhaust unit 15 exhausts gas from the through holes 27 that are formed near a position where the substrate W is placed during the heat treatment. This achieves effective reduction in oxygen concentration around the substrate W that may influence film deposition largely during the heat treatment. Moreover, since the dust generated due to slide of the support pins 61 on the mechanical seals 65 is discharged without entering into the heat treating space HS, the substrate W is able to be treated cleanly.

The upper gas supply unit 5, the chamber exhaust unit 9, the lower gas supply unit 13, the support pin seal exhaust unit 15, and the actuators 59, 69 are controlled en bloc by a controller 17. The controller 17 contains a CPU, a memory, and a timer, each of which is not shown. The controller 17 causes the memory, not shown, to store in advance a plurality of recipes that specify conditions for treating the substrate. Moreover, the controller 17 causes the memory to store in advance a relative relationship between a level of the concentration level and the lowering process of the oxygen concentration, which is to be mentioned later. The setting unit 19 causes an operator to provide various instructions. For instance, the setting unit 19 causes the operator to select one of the recipes or to provide an instruction for starting treatment or for operation when an alarm is given. The setting unit 19 is composed of a keyboard used for setting recipe numbers or the lowering process of the oxygen concentration.

Here, the setting unit 19 described above corresponds to the "setting device" in the present invention.

Figure 2:
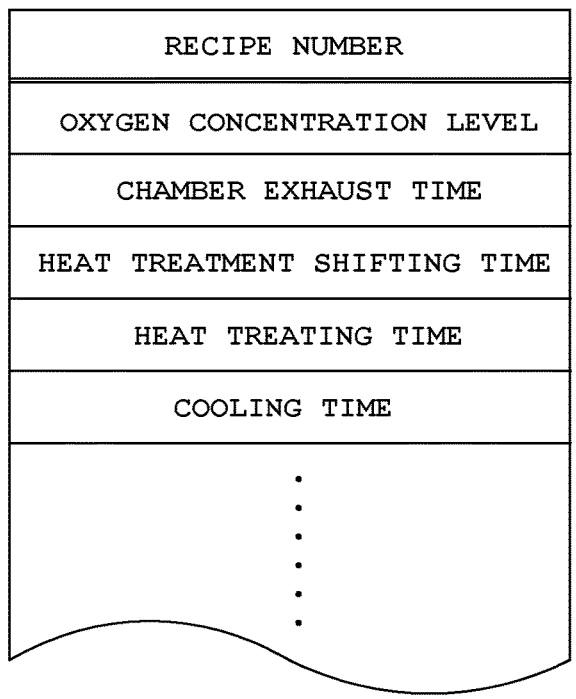
FIG. 2 schematically illustrates one example of recipes.

Reference is now made to FIG. 2. FIG. 2 schematically illustrates one example of recipes.

As illustrated in FIG. 2 in the present embodiment, an oxygen concentration level (target concentration), a chamber exhaust time, a heat treatment shifting time, a heat treating time, a cooling time, and the like, are stored in the recipes each distinguished with the numbers applied thereto, and these are referred to by the controller 17. The heat treatment shifting time is lapsed time from an exhaust starting time when the oxygen concentration within the heat treating space HS is lowered to the target value or less in the heat treatment. This time is measured and determined in advance through examinations while the oxygen concentration sensor 49 is provided. The above recipes are determined in accordance with the DSA process, for example. Especially, the oxygen concentration level of the recipes specifies the target concentration and time needed for reaching the target concentration. Moreover, since the degree of influence for film deposition varies depending on the types of the treated films or the DSA process, the oxygen concentration level may be specified from the recipes in accordance with the degree of influence.

Figure 3:
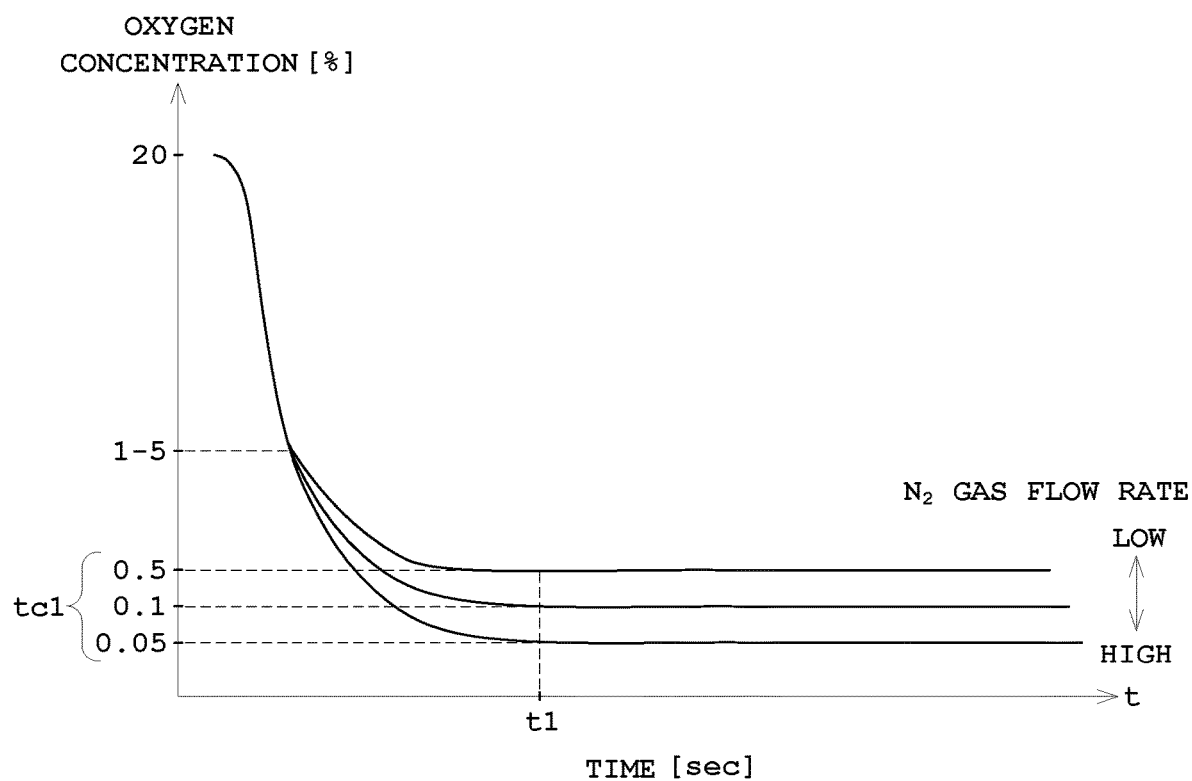
FIG. 3 is a graph illustrating how an oxygen concentration is lowered during a first lowering process.
Figure 4:
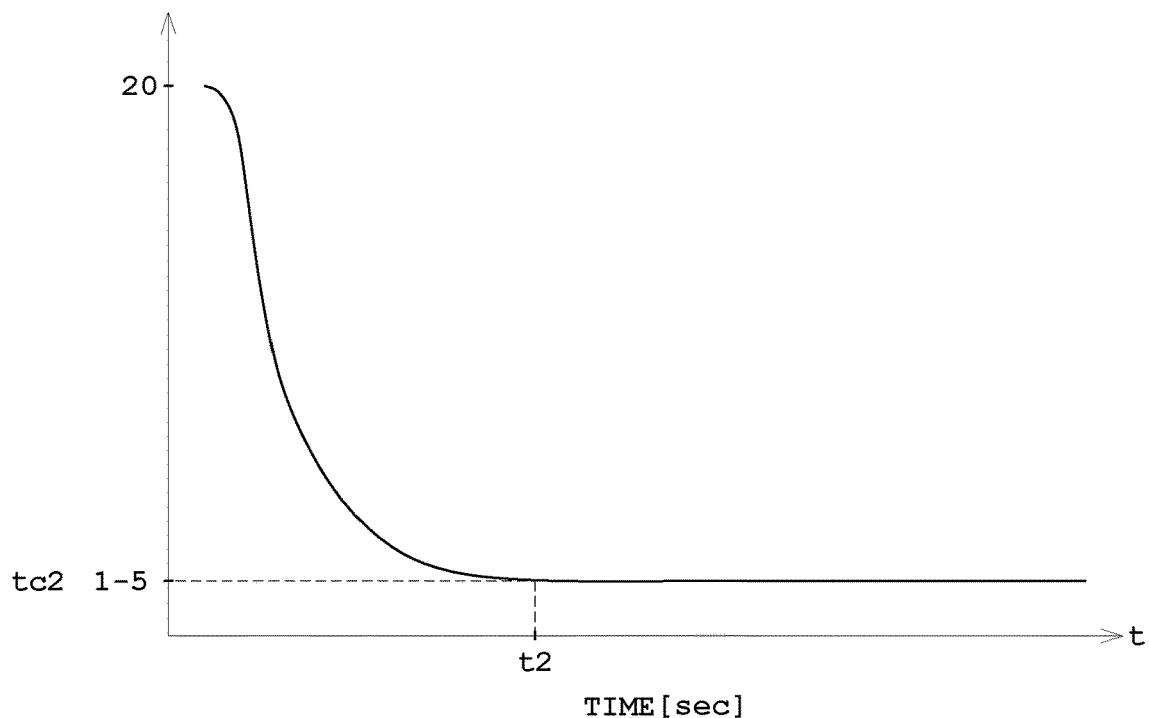
FIG. 4 is a graph illustrating how an oxygen concentration is lowered during a second lowering process.
Figure 5:
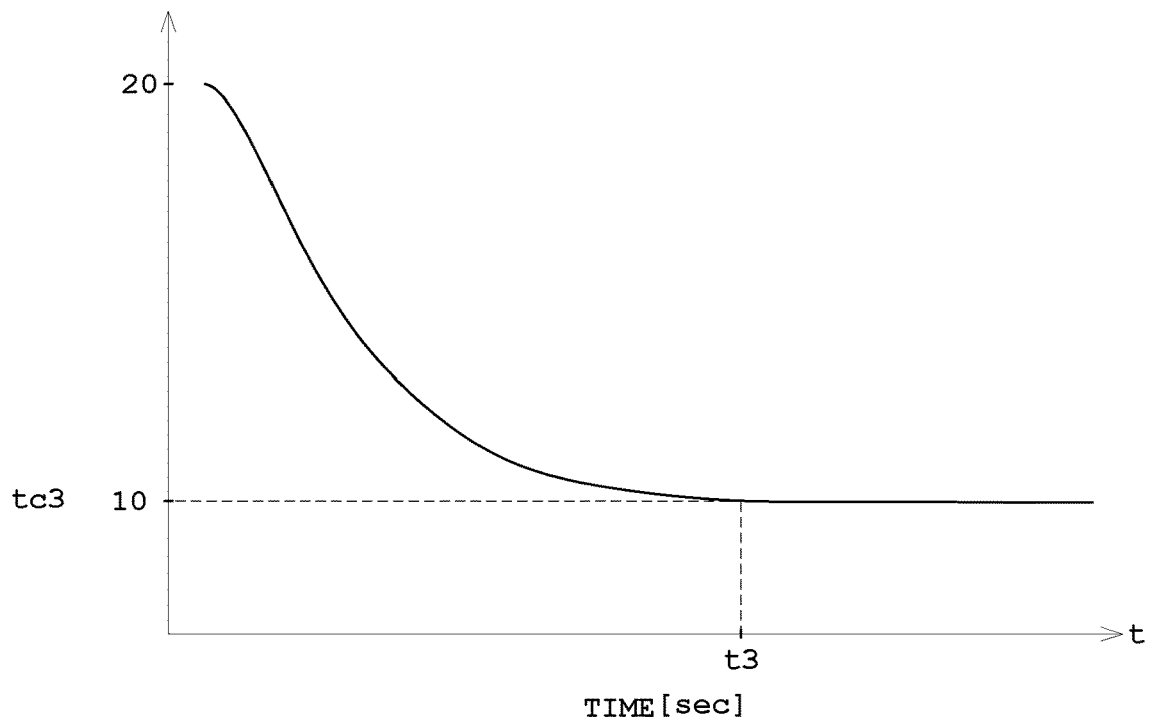
FIG. 5 is a graph illustrating how an oxygen concentration is lowered during a third lowering process.

Specifically, the oxygen concentration level described above corresponds to a lowering process for the oxygen concentration as under. If the oxygen concentration level is set, the lowering process is determined. Reference is now made to FIGS. 3 to 5. FIG. 3 is a graph illustrating variation in lowering an oxygen concentration during a first lowering process. FIG. 4 is a graph illustrating variation in lowering an oxygen concentration during a second lowering process. FIG. 5 is a graph illustrating variation in lowering an oxygen concentration during a third lowering process.

The lowering process includes, for example, three types as under.

The first lowering process is performed by exhaust of the gases from the through holes 27 by the support pin seal exhaust unit 15, supply of the nitrogen gas from the gas supply buffer 51 by the upper supplying unit 5, and supply of the nitrogen gas from the openings 45 and the topside plate supply port 29 by the lower supplying unit 13. The variation in lowering the oxygen concentration during the first lowering process is illustrated, for example, in FIG. 3. Here, a time t1 represents time when the oxygen concentration is substantially constant at a target concentration tc1 (e.g., 0.5%, 0.1%, 0.05%). The time t1 is shifted depending on a variation in flow rate of the gas. Now, it is typically assumed that the concentration reaches the target concentration tc1 at the time t1 to finish lowering. With the first lowering process, the gases are exhausted from the through holes 27 disposed on the rear side of the substrate W, leading to a stable airflow in the heat treatment atmosphere HS around the front face of the substrate W. Therefore, the heat treatment to the treated film is performable in a stable manner.

The second lowering process is performed by exhaust of the gases from the through holes 27 by the support pin seal exhaust unit 15, exhaust of the gases from the through holes 37 by the chamber exhaust unit 3, supply of the nitrogen gas from the gas supply buffer 51 by the upper supplying unit 5, and supply of the nitrogen gas from the openings 45 and the topside plate supply port 29 by the lower supplying unit 13. The variation in lowering the oxygen concentration during the second lowering process is illustrated, for example, in FIG. 4. Here, a time t2 represents time when the oxygen concentration is substantially constant and reaches a target concentration tc2 (e.g., 1 to 5%). The time t2 is shifted depending on a variation in exhausted flow rate of the gases and the flow rate of the nitrogen gas. Now, it is typically assumed that the concentration reaches the target concentration tc2 at the time t2 to finish lowering. With the second lowering process, since the gases are exhausted and the nitrogen gas is supplied additionally, the oxygen is effectively ejectable from the heat treating space HS. Moreover, the gases are exhausted from both the exhaust port 37 and the through holes 27, achieving a constantly lowered oxygen concentration for a short period of time.

The third lowering process is performed only by exhaust of the gases from the through holes 27 by the support pin seal exhaust unit 15, and exhaust of the gases from the through holes 37 by the chamber exhaust unit 3. The variation in lowering the oxygen concentration during the third lowering process is illustrated, for example, in FIG. 5. Here, a time t3 represents time when the oxygen concentration is substantially constant at a target concentration tc3 (e.g., 10%). The time t3 is shifted depending on a variation in exhausted flow rate. Now, it is typically assumed that the concentration reaches the target concentration tc3 at the time t3 to finish lowering. With the third lowering process, the oxygen is ejectable from the heat treating space only by exhausting the gases without supplying any inert gas. Consequently, no inert gas is used, leading to a suppressed manufacturing cost.

Now a temporal relationship of t3>t2>t1, for example, is established until the lowering processes described above each finish. On the other hand, a level relationship is established among the target concentrations of tc1<tc2<tc3. Consequently, the heat treatment shifting time becomes longer in the second lowering process, the first lowering process, and the third lowering process in this order. Accordingly, if the equal processing time is provided, throughput is reduced in this order. In addition, the target concentration influences a quality of film deposition. Accordingly, the oxygen concentration level is indicated in the recipes such that any of the lowering processes are selected under consideration of the throughput needed for the DSA process and the quality of the film deposition.

Figure 6:
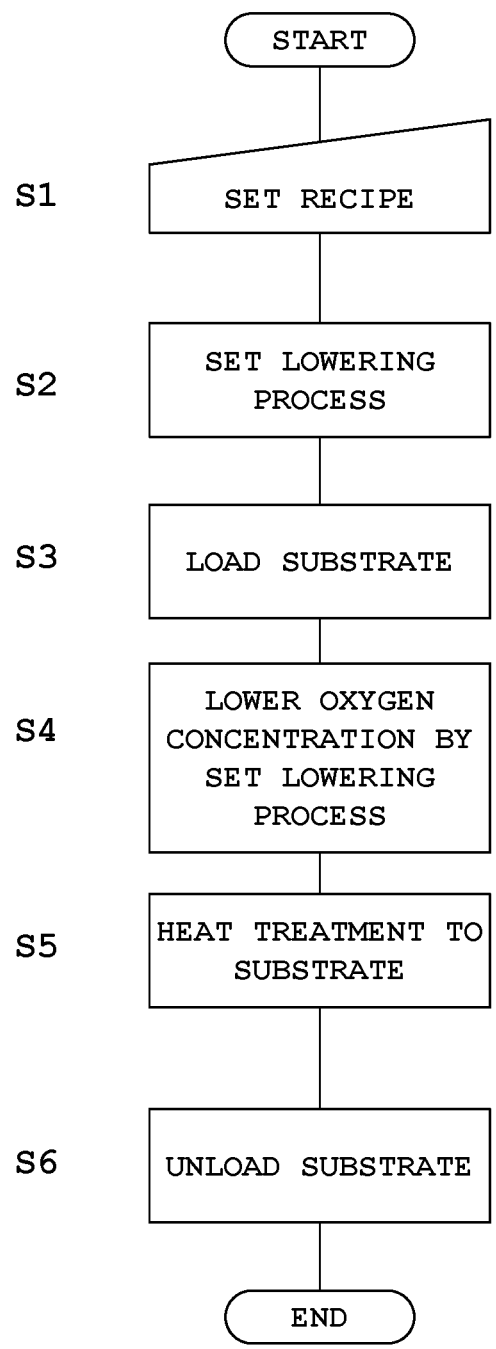
FIG. 6 is a flow chart of treating a substrate.

The following describes the heat treatment by the apparatus mentioned above with reference to FIG. 6. FIG. 6 is a flow chart of treating the substrate.

Steps S1, S2 (Setting Step)

An operator of the apparatus operates the setting unit 19 to specify the recipe number, thereby setting the corresponding recipe. This allows setting of the condition for treating the substrate W. The controller 17 performs control to set the lowering process depending on the oxygen concentration level specified in the recipes.

If no oxygen concentration level is specified in the recipes, the operator may operate the setting unit 19 to set the level manually.

Step S3

Then, the controller 17 operates the actuator 59 to move the shutter body 57 downwardly to load the substrate W into the heat treating space HS with a transport mechanism, not shown. At this time, the substrate W is held with the support pins 61 moved out to the deliver position.

Step S4 (Oxygen Concentration Lowering Step)

The controller 17 operates the units individually in accordance with the set recipes for lowering. For instance, when the second lowering process is set, the "exhausting step" is performed by exhaust of the gases from the through holes 27 by the support pin seal exhaust unit 15 and exhaust of the gases from the through holes 37 by the chamber exhaust unit 3, and the "inert gas supplying step" is performed by supply of the nitrogen gas from the gas supply buffer 51 by the upper supplying unit 5, and supply of the nitrogen gas from the openings 45 and the topside plate supply port 29 by the lower supplying unit 13.

Step S5 (Heat Treatment Step)

When the time has reached the heat treatment shifting time specified in the recipes, the controller 17 causes the actuator 59 to move the support pins 61 outwardly to the retracted position. Accordingly, the substrate W is placed on the heat treating plate 23 to start a heat treatment.

Step S6

When the time has reached the heat treating time specified in the recipes, the controller 17 causes the actuator 69 to move the support pins 61 to the deliver position. Then, the actuator 59 is operated to move the shutter body downwardly to unload the substrate W subjected to the heat treatment out of the heat treating space HS with the transport mechanism, not shown.

With the embodiment of the present invention, the oxygen concentration is lowered in accordance with the set lowering process, and thereafter the heat treatment is performed. Accordingly, the heat treatment is performed to a substrate W while an oxygen concentration in a heat treating space HS is lowered. Consequently, a treatment atmosphere within the heat treating space is able to be made suitable for a heat treatment process, leading to appropriate film deposition. In addition, the oxygen concentration is lowered in accordance with a concentration level in recipes. This avoids an excessively lowered oxygen concentration, leading to prevention of the reduced throughput.

The present invention is not limited to the foregoing examples, but may be modified as follows.

(1) In the embodiment mentioned above, the substrate W has a treated film coated thereon that is made from a directed self-assembly material. Such a substrate W is not limitative in the present invention. For instance, the present invention is applicable to the treatment that the oxygen concentration in the heat treating space HS adversely affects, such as treatment of a substrate to which a spin on glass (SOG) solution is applied.

(2) In the embodiments described above, the three types of lowering processes are set. However, the present invention is not limitative to this. For instance, the following is adoptable. That is, the flow rate during the exhaust of gases or the supply of the inert gas is set in detail in each of the lowering processes described above, whereby four or more types of lowering processes are set to correspond to an oxygen concentration level set in detail in accordance with the processes of treating the substrate.

(3) In the embodiments described above, the lowering process is determined by setting the recipe. However, the present invention is not limitative to this embodiments. For instance, the following is adoptable. That is, the oxygen concentration level is not specified in the recipes, but is set along with the setting of the recipes, whereby the lowering process is set.

(4) In the embodiment mentioned above, the nitrogen gas has been described as one example of the inert gas. However, another type of inert gas such as argon or helium may be used.

INDUSTRIAL APPLICABILITY

As described above, the present invention is suitable for performing the heat treatment to a semiconductor wafer, a substrate for liquid crystal magnetic disk, a substrate for flat panel display (FPD) like a substrate for organic electroluminescence (EL), a substrate for optical display, a for a photomask substrate, an optical magnetic disk substrate, a substrate for photomask, and a solar cell substrate (hereinafter, simply referred to as a substrate).

REFERENCE SIGNS LIST

W . . . substrate
1 . . . heat treatment plate unit
3 . . . heat treatment chamber
5 . . . upper gas supplying unit
7 . . . shutter body
9 . . . chamber exhaust unit
11 . . . support pin lifting member
13 . . . lower gas supplying unit
15 . . . support pin seal exhaust unit
17 . . . controller
19 . . . setting unit
23 . . . heat treating plate
25 . . . heater
27 . . . through hole
31 . . . cover
37 . . . exhaust port
51 . . . gas supply buffer
57 . . . shutter body
61 . . . support pin
65 . . . mechanical seal
69 . . . actuator
63 manifold
71 . . . exhaust port
HS . . . heat treating space
tc1 to tc3 . . . target concentration

What is claimed is:

1. A substrate treating method for performing a heat treatment to a substrate having a treated film formed thereon within a heat treating space of a heat treating chamber, the method comprising:
    a setting step of setting a lowering process in accordance with a concentration level from recipes where conditions of treating the substrate are specified;
    an oxygen concentration lowering step of lowering an oxygen concentration in the heat treating space in accordance with the set lowering process; and
    a heat treatment step of performing the heat treatment to the substrate within the heat treating space after the setting step and the oxygen concentration lowering step: wherein the oxygen concentration lowering step includes an exhausting stet of exhausting gases within the heat treating space.

2. The substrate treating method according to claim 1, wherein the oxygen concentration lowering step includes: the exhausting step of exhausting gases within the heat treating space; and an inert gas supplying step of supplying an inert gas into the heat treating space.

3. The substrate treating method according to claim 2, wherein the exhausting step is performed from through holes through which support pins moving forward/backward from a heat treating plate are inserted.

4. The substrate treating method according to claim 2, wherein
    the exhausting step is performed from an exhaust port of a cover that surrounds a heat treating plate and through holes through which support pins moving forward/backward from the heat treating plate are inserted.

5. The substrate treating method according to claim 1, wherein
    the treated film is made from a directed self-assembly material.

* * * * *